US008932905B1

(12) United States Patent
Safai

(10) Patent No.: US 8,932,905 B1
(45) Date of Patent: Jan. 13, 2015

(54) SEMICONDUCTOR CIRCUIT SYSTEM FOR A COMPOSITE STRUCTURE

(71) Applicant: The Boeing Company, Chicago, IL (US)

(72) Inventor: Morteza Safai, Newcastle, WA (US)

(73) Assignee: The Boeing Company, Chicago, IL (US)

( * ) Notice: Subject to any disclaimer, the term of this patent is extended or adjusted under 35 U.S.C. 154(b) by 277 days.

(21) Appl. No.: 13/647,813

(22) Filed: Oct. 9, 2012

(51) Int. Cl.
*H01L 51/40* (2006.01)
*H01L 21/50* (2006.01)
*H01L 23/48* (2006.01)
*H01L 27/28* (2006.01)
*H05K 1/11* (2006.01)
*H05K 3/46* (2006.01)

(52) U.S. Cl.
USPC ............... 438/106; 438/99; 438/26; 438/780; 257/40; 257/414; 257/428; 257/E21.09

(58) Field of Classification Search
CPC .................. H05K 1/0298; H05K 1/16; H05K 2201/10159; H05K 2201/10212; H05K 2203/1545; H05K 3/207; H05K 2201/0166
USPC ........ 257/40, 414, 428, E21.09; 438/99, 106, 438/26, 780
See application file for complete search history.

(56) References Cited

U.S. PATENT DOCUMENTS

| 6,087,196 | A  | * | 7/2000 | Sturm et al. ................... 438/29 |
| 8,669,625 | B2 | * | 3/2014 | Shinohara et al. ............ 257/414 |

| 2005/0282307 | A1 | * | 12/2005 | Daniels ............................ 438/82 |
| 2006/0073403 | A1 | * | 4/2006 | Kataoka et al. ............ 430/108.22 |
| 2006/0104045 | A1 | * | 5/2006 | Yamazaki et al. ............... 362/84 |
| 2006/0151616 | A1 | * | 7/2006 | Sheats ............................ 235/492 |
| 2006/0152960 | A1 | * | 7/2006 | Sheats ............................ 365/112 |
| 2009/0039343 | A1 | * | 2/2009 | Kugler ............................ 257/40 |

OTHER PUBLICATIONS

First inkjet-Printed Carbon Nanotube Circuit by Chris Jablonski.*
Organic Semiconductor Breakthrough Could Speed Flexible Circuits by Neil Savage.*
Gorman et al., "Fabrication of Patterned, Electrically Conducting Polypyrrole Using a Self-Assembled Monolayer: A Route to All-Organic Circuits," Chemistry of Materials, vol. 7, No. 3, Mar. 1995, pp. 526-529.
"Researchers Develop Efficient Organic Solar Cell," Georgia Institute of Technology, at PHYSorg.com, Dec. 2004, 2 pages, accessed Sep. 12, 2012 http://phys.org/news2339.html.
"Organic Semiconductor," Wikipedia, Jul. 2012, 6 pages, accessed Jul. 10, 2012 http://en.wikipedia.org/wiki/Organic_semiconductor.
Briseno et al., "Flexible electronics advance boosts performance, manufacturing," Stanford University, at PHYSorg.com, Dec. 2006, 2 pages, accessed Sep. 18, 2012 http://phys.org/news85243472.html.
Sanjana et al., "A fast flexible ink-jet printing method for patterning dissociated neurons in culture," Journal of Neuroscience Methods, vol. 136, No. 2, Jul. 2004, pp. 151-163.

* cited by examiner

*Primary Examiner* — Ha Tran T Nguyen
*Assistant Examiner* — Thai T Vuong
(74) *Attorney, Agent, or Firm* — Yee & Associates, P.C.

(57) ABSTRACT

A method and apparatus for forming an organic semiconductor circuit. A circuit printer is positioned relative to a location on a surface of a composite structure. A number of organic materials is deposited in a pattern on the surface of the composite structure at the location to form the organic semiconductor circuit on the surface of the composite structure at the location.

16 Claims, 8 Drawing Sheets

SEMICONDUCTOR CIRCUIT SYSTEM FOR A COMPOSITE STRUCTURE

BACKGROUND INFORMATION

1. Field

The present disclosure relates generally to aircraft and, in particular, to aircraft employing composite parts. Still more particularly, the present disclosure relates to circuit systems formed on a composite fuselage.

2. Background

Aircraft are being designed and manufactured with greater and greater percentages of composite materials. Composite materials are used in aircraft to decrease the weight of the aircraft. This decreased weight improves performance features such as payload capacity and fuel efficiency. Further, composite materials provide longer service life for various components in an aircraft.

Composite materials may be tough, light-weight materials created by combining two or more functional components. For example, a composite material may include reinforcing fibers bound in a polymer resin matrix. The fibers may be unidirectional or may take the form of a woven cloth or fabric. The fibers and resins may be arranged and cured to form a composite structure.

Using composite materials to create aerospace composite structures may allow for portions of an aircraft to be manufactured in larger pieces or sections. For example, a fuselage in an aircraft may be created in cylindrical sections and then assembled to form the fuselage of the aircraft. Other examples include, without limitation, wing sections joined to form a wing or stabilizer sections joined to form a stabilizer.

In manufacturing composite structures, layers of composite material may be laid up on a tool. The layers of composite material may be comprised of fibers in sheets. These sheets may take the form of, for example, without limitation, fabrics, tape, tows, or other suitable configurations for the sheets. In some cases, resin may be infused or pre-impregnated into the sheets. These types of sheets are commonly referred to as prepreg.

After the different layers of composite material have been laid up on the tool, the layers of composite material may be consolidated and cured upon exposure to temperature and pressure, thus forming the final composite structure. This type of construction may greatly reduce the weight of the aircraft as compared to currently manufactured aircraft using metal components. However, the aircraft still includes various components that are not formed from composite materials. These components may add more the weight and may use more space within the aircraft than desired.

Even with these types of weight and space savings, the amount of weight of an aircraft still may be greater than desired and the amount of space available for passengers may not be as great as desired. Therefore, it would be desirable to have a method and apparatus that takes into account at least some of the issues discussed above, as well as other possible issues.

SUMMARY

In one illustrative embodiment, a method for forming an organic semiconductor circuit is present. A circuit printer is positioned relative to a location on a surface of a composite structure. A number of organic materials are deposited in a pattern on the surface of the composite structure at the location to form the organic semiconductor circuit on the surface of the composite structure at the location.

In another illustrative embodiment, an apparatus comprises a circuit printer and a controller. The circuit printer is configured to deposit a number of organic materials for an organic semiconductor circuit. The controller is configured to control the circuit printer to deposit the number of organic materials in a pattern on a surface of a composite structure at a location to form the organic semiconductor circuit on the surface of the composite structure.

In yet another illustrative embodiment, an apparatus comprises a composite structure and an organic semiconductor circuit formed on the composite structure.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1:
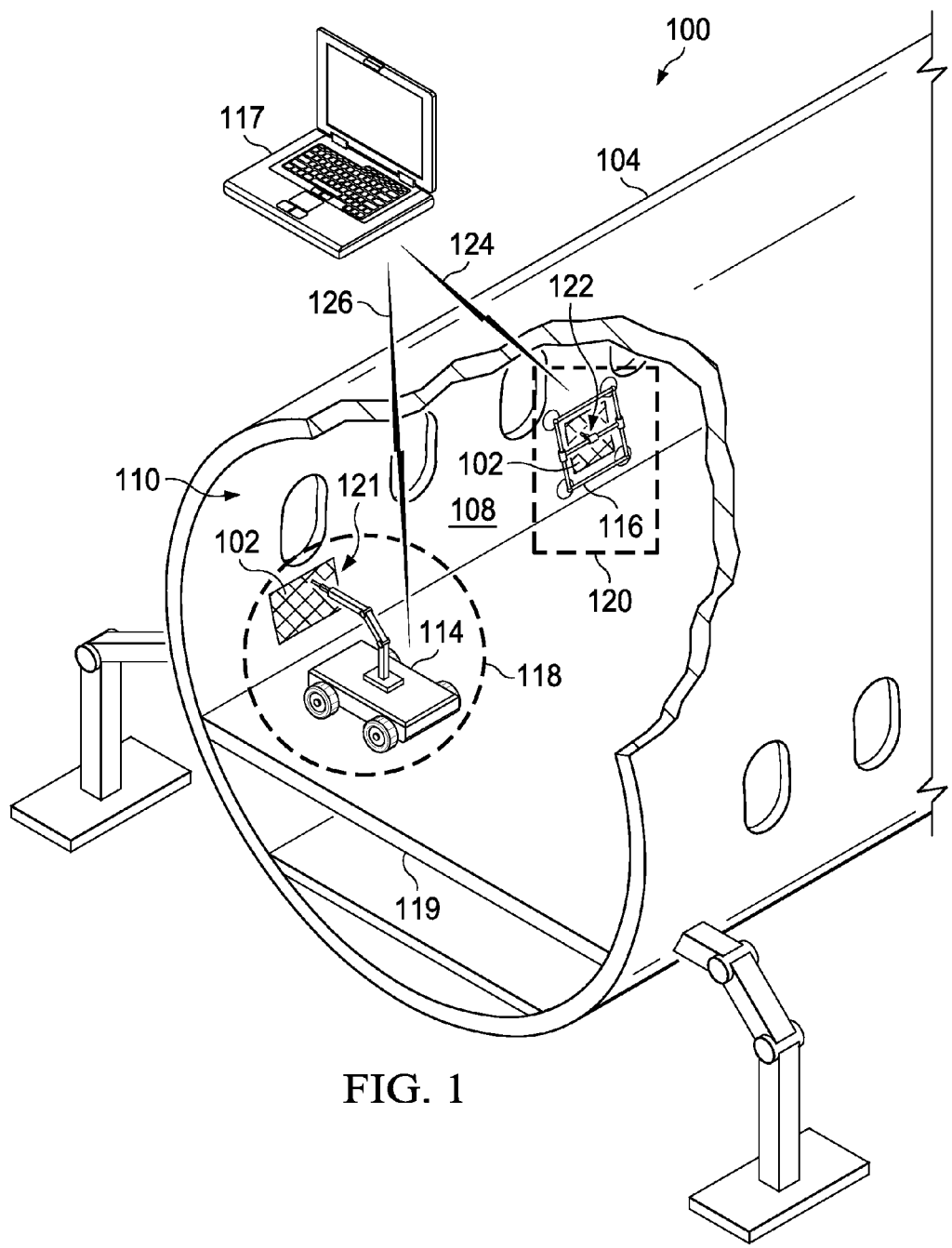
FIG. 1 is an illustration of a manufacturing environment for an aircraft in accordance with an illustrative embodiment.

The illustrative embodiments recognize and take into account one or more different considerations. For example, the illustrative embodiments recognize and take into account that some of the components in an aircraft network data processing system may take up more space and weigh more than desired.

In this illustrative example, the aircraft network data processing system may be comprised of various devices with processors connected to a network. These devices may include, for example, without limitation, a navigation computer, an autopilot, an in-flight entertainment system, an environmental control system, and other systems.

The network providing communications between these devices may be comprised of wires. These wires may be arranged in bundles within the interior of the aircraft. These bundles may take up more space and may weigh more than desired.

In another illustrative example, an in-flight entertainment system may have displays mounted in head rests. The hardware devices for displaying movies, videos, shows, and other information on the displays may be located under passenger seats. The location and configuration of these devices may take more room than desired. For example, if an aircraft has 250 passenger seats, the aircraft may have devices in the form of hardware circuits located in housings under the passenger seats for some or all of the 250 passenger seats. The circuitry for these devices may be heavier than desired.

The illustrative embodiments also recognize and take into account that when these devices are placed under a passenger seat, an amount of space under the passenger seat may not be as great as desired. As a result, the amount of space available for storing passenger items under the seats may be reduced.

Additionally, the illustrative embodiments recognize and take into account that the use of organic semiconductor circuits may be replace different components in a network data processing system. These components may include wires, hardware devices in in-flight entertainment systems, and other suitable components containing circuits. The organic semiconductor circuits used to implement these devices may be formed on composite structures. These composite structures may include, for example, the interior walls of a fuselage. In this manner, the amount of space needed for a network data processing system as well as other electrical devices may be reduced.

Thus, the illustrative embodiments provide a method and apparatus for forming an organic semiconductor circuit in an aircraft. In one illustrative embodiment, an apparatus comprises a circuit printer and structure controller. The circuit printer is configured to deposit a number of organic materials for an organic semiconductor circuit. The controller is configured to control the circuit printer to deposit the number of organic materials in a pattern on a surface of a composite structure at a location to form the organic semiconductor circuit on the surface of the composite structure.

With reference now to the figures and, in particular, with reference to FIG. 1, an illustration of a manufacturing environment for an aircraft is depicted in accordance with an illustrative embodiment. In this depicted example, aircraft manufacturing environment 100 is an example of a manufacturing environment that may be used to form circuits on a composite structure for an aircraft in accordance with an illustrative embodiment.

In this illustrative example, circuits 102 inside fuselage section 104 are formed on fuselage section 104 using a circuit manufacturing system. In this illustrative example, circuits 102 are formed on wall 108 in interior 110 of fuselage section 104. As depicted, circuits 102 comprise organic semiconductor circuits.

In this illustrative example, the circuit manufacturing system includes a number of different components. As depicted, the circuit manufacturing system comprises circuit printer 114, circuit printer 116, and computer 117.

In this illustrative example, circuit printer 114 is at location 118 within interior 110 of fuselage section 104. Circuit printer 114 is configured to form organic semiconductor circuits in circuits 102 at location 118.

As depicted, circuit printer 114 is configured to move on platform 119 within interior 110 of fuselage section 104. In this manner, circuit printer 114 may move to other locations within interior 110 of fuselage section 104. Platform 119 may be a platform installed for forming organic semiconductor circuits in circuits 102. In other illustrative examples, platform 119 may be a floor for fuselage section 104.

Circuit printer 116 is at location 120 within interior 110 of fuselage section 104. In this illustrative example, circuit printer 116 is attached to wall 108 at location 120. Circuit printer 116 is also configured to form organic semiconductor circuits in circuits 102 on wall 108 of fuselage section 104 at location 120. In this illustrative example, circuit printer 116 may be fixed or may be mobile on wall 108 of fuselage section 104.

In this illustrative example, circuit printer 114 includes inkjet system 121. Circuit printer 116 includes inkjet system 122. In this manner, circuit printer 114 and circuit printer 116 may print patterns for organic semiconductor circuits in circuits 102 in a similar fashion to printing images or text on a substrate using ink. Instead of ink, inkjet system 121 and inkjet system 122 spray materials onto wall 108 in a pattern to form organic semiconductor circuits in circuits 102.

In these illustrative examples, the formation of organic semiconductor circuits in circuits 102 is controlled by computer 117. Computer 117 communicates with circuit printer 116 and circuit printer 114 through wireless communications link 124 and wireless communications link 126, respectively.

Figure 2:
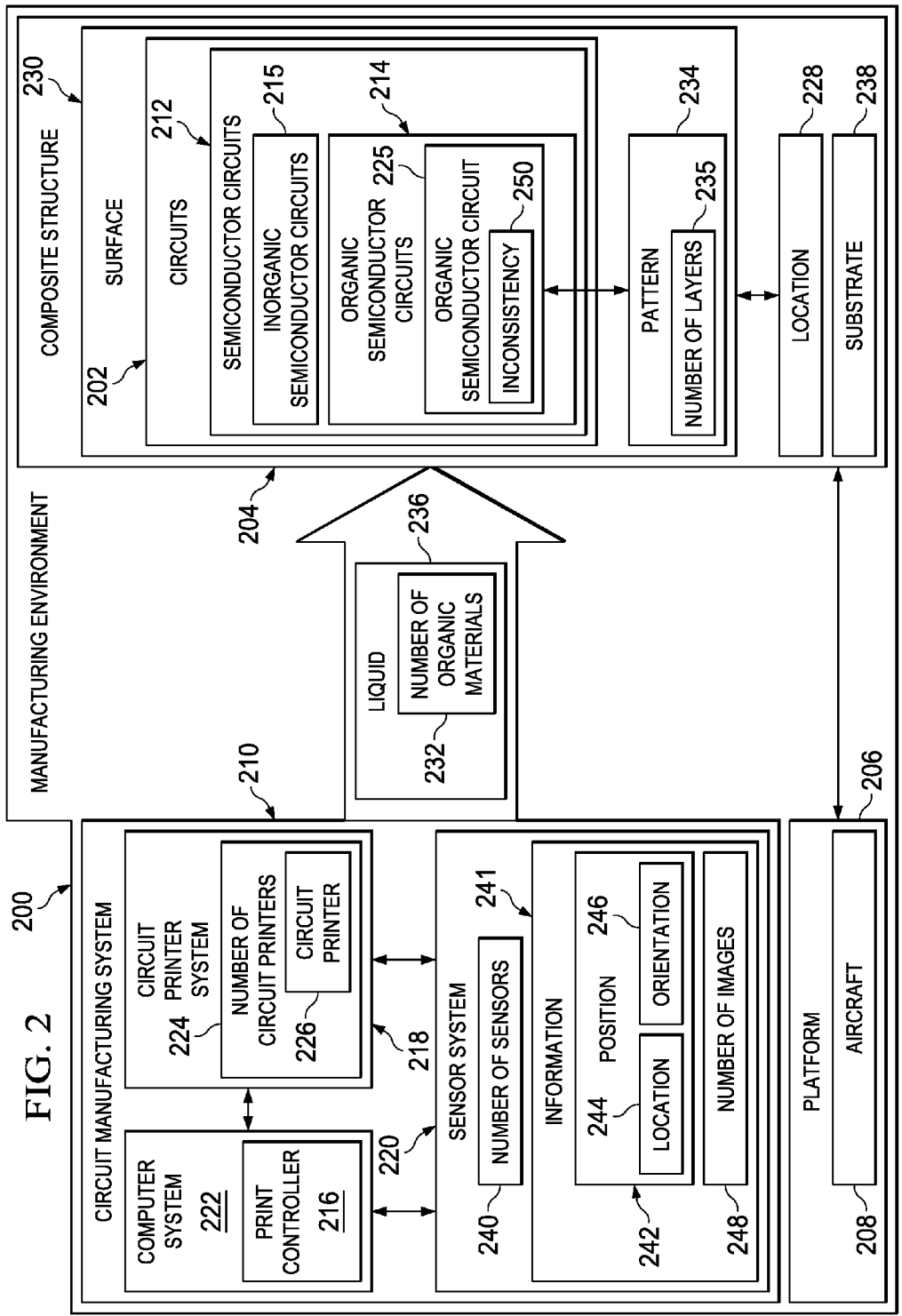
FIG. 2 is an illustration of a block diagram of a manufacturing environment in accordance with an illustrative embodiment.

With reference now to FIG. 2, an illustration of a block diagram of a manufacturing environment is depicted in accordance with an illustrative embodiment. In this illustrative example, aircraft manufacturing environment 100 in FIG. 1 is an example of one implementation for manufacturing environment 200 shown in block form in FIG. 2.

As depicted, circuits 202 may be formed on composite structure 204 in manufacturing environment 200. Composite structure 204 may be comprised of any suitable composite material. For example, the composite material used in composite structure 204 may be comprised of a reinforcement selected from at least one of carbon, graphite, and other suitable materials that may be have resin as a matrix.

As used herein, the phrase "at least one of", when used with a list of items, means different combinations of one or more of the listed items may be used and only one of each item in the list may be needed. For example, "at least one of item A, item B, and item C" may include, without limitation, item A or item A and item B. This example also may include item A, item B, and item C or item B and item C. In other examples, "at least one of" may be, for example, without limitation, two of item A, one of item B, and ten of item C; four of item B and seven of item C; and other suitable combinations.

In this illustrative example, composite structure 204 is part of platform 206. Platform 206 may be aircraft 208 in these illustrative examples.

Circuits 202 are formed on composite structure 204 using circuit manufacturing system 210. In particular, circuit manufacturing system 210 may form circuits 202 in the form of semiconductor circuits 212.

In these illustrative examples, semiconductor circuits 212 are electronic circuits formed by depositing materials. Semiconductor circuits 212 may be, for example, integrated circuits formed on composite structure 204 in these illustrative examples. Further, semiconductor circuits 212 may also include trace lines that interconnect other electronic circuits with each other within semiconductor circuits 212.

In these illustrative examples, semiconductor circuits 212 may take the form of integrated circuits or monolithic integrated circuits. More specifically, semiconductor circuits 212 may take the form of organic semiconductor circuits 214 in these illustrative examples. Of course, semiconductor circuits 212 also may include inorganic semiconductor circuits 215 in some illustrative examples.

As depicted, circuit manufacturing system 210 includes print controller 216, circuit printer system 218, and sensor system 220. Print controller 216 may be implemented in software, hardware, or a combination of the two. When software is used, the operations performed by print controller 216 may be implemented in program code configured to run on a processor unit. When hardware is employed, the hardware may include circuits that operate to perform the operations in print controller 216.

In these illustrative examples, the hardware may take the form of a circuit system, an integrated circuit, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. Additionally, the processes may be implemented in organic components integrated with inorganic components and/or may be comprised entirely of organic components excluding a human being. For example, the processes may be implemented as circuits in organic semiconductors.

As depicted, print controller 216 may be implemented in computer system 222. Computer system 222 may comprise one or more computers. When more than one computer is present in computer system 222, those computers may be in communication with each other over a communications medium such as a network.

As depicted, circuit printer system 218 is comprised of number of circuit printers 224. Circuit printer 114 and circuit printer 116 in FIG. 1 are examples of physical implementations for circuit printers in number of circuit printers 224.

As used herein, a "number of" when used with reference to items means one or more items. For example, a number of circuit printers 224 is one or more circuit printers.

In this illustrative example, print controller 216 may control the operation of circuit printer system 218 to form organic semiconductor circuit 225 in organic semiconductor circuits 214 on composite structure 204. For example, print controller 216 may control circuit printer 226 in number of circuit printers 224 in circuit printer system 218 to form organic semiconductor circuit 225 in organic semiconductor circuits 214 on composite structure 204.

As depicted, print controller 216 may control the positioning of circuit printer 226 relative to location 228 on surface 230 of composite structure 204. In these illustrative examples, location 228 may have various sizes. For example, location 228 may be about one square inch, one square yard, ten square yards, or some other portion of composite structure 204. Positioning of circuit printer 226 may include moving a portion of circuit printer 226 or all of circuit printer 226 relative to location 228 in these illustrative examples.

Further, print controller 216 may control circuit printer system 218 to deposit number of organic materials 232 in pattern 234 on surface 230 of composite structure 204 at location 228 to form organic semiconductor circuit 225 on surface 230 of composite structure 204 at location 228. In these illustrative examples, pattern 234 may have number of layers 235. When more than one layer is present in number of layers 235, these layers may overlap each other in different places in location 228 to form various components within organic semiconductor circuit 225.

Organic semiconductor circuit 225 may be comprised of various components such as, for examples, without limitation, a field effect transistor, a diode, a resistor, a capacitor, trace lines, and other suitable components. One or more of these components may be part of at least one of a sensor, a controller, a trace line, an environmental system controller, an in-flight entertainment system, a health monitoring system, and other suitable devices.

In these illustrative examples, number of organic materials 232 may be any material available for use in at least one of a liquid form, suspended in a liquid, dissolved in a liquid, or in other suitable forms conducive for forming organic semiconductor circuit 225 on surface 230 of composite structure 204. Number of organic materials 232 may be, for example, ink materials. Number of organic materials 232 may be selected to function as at least one of a conductor, a semiconductor, a dielectric, an insulator, or perform some other suitable function for use in forming organic semiconductor circuit 225.

For example, number of organic materials 232 may include at least one of a conductive polymer, polystyrene sulfonate, polyaniline, 7,7,8,8-Tetracyanoquinodimethane, 2,3,5,6-Tetrafluoro-7,7,8,8-tetracyanoquinodimethane, 1,4,5,8-Naphthalenetetracarboxylic dianhydride, Perylene-3,4,9,10-tetracarboxylic dianhydride, N,N'-Dipentyl-3,4,9,10-perylenedicarboximide, 2,2':5',2"-Terthiophene, 9α-Sexithiophene, Bis(ethylenedithio)tetrathiafulvalene, and other suitable materials. Number of organic materials 232 may be placed into liquid 236 for application onto surface 230 of composite structure 204 in pattern 234.

In these illustrative examples, composite structure 204 forms substrate 238. In other illustrative examples, substrate 238 may be a layer placed onto composite structure 204 to form surface 230 for composite structure 204. For example, substrate 238 may be a plastic film, indium tin oxide coated polyethylene terephthalate, indium tin oxide coated aluminosilicate glass slides, or some other suitable type of substrate.

In these illustrative examples, sensor system 220 is comprised of number of sensors 240. Number of sensors 240 may be used to generate information before, during, and/or after the forming of organic semiconductor circuit 225.

For example, sensor system 220 may generate information 241 about location 228 and, in particular, position 242 of circuit printer 226 relative to location 228. Position 242 may include location 244 and orientation 246 for circuit printer 226.

Further, number of sensors 240 in sensor system 220 may generate information 241 in the form of number of images 248. Number of images 248 of organic semiconductor circuit 225 may be generated as organic semiconductor circuit 225 is formed on surface 230 of composite structure 204 at location 228.

With number of images 248, print controller 216 may inspect organic semiconductor circuit 225 for inconsistencies after organic semiconductor circuit 225 is formed on composite structure 204, as organic semiconductor circuit 225 is formed on composite structure 204, or both. In other words, as organic semiconductor circuit 225 is being formed, a determination may be made as to whether inconsistency 250 is present in organic semiconductor circuit 225.

In these illustrative examples, inconsistency 250 is present on organic semiconductor circuit 225 if a layer in number of layers 235 for pattern 234 is not deposited in a desired manner. For example, if a layer is too thick, is in an undesired location, has an undesired shape, or some other undesired feature, then organic semiconductor circuit 225 may be considered to have inconsistency 250.

If inconsistency 250 is present, then a corrective action may be taken to rework number of organic materials 232 deposited on surface 230. If inconsistency 250 is detected prior to completing formation of organic semiconductor circuit 225, rework may be performed at that time. In this manner, rework may allow organic semiconductor circuit 225 to be completed without having to start over.

In this manner, the time to manufacture organic semiconductor circuit 225 may be reduced. Further, the expense of manufacturing organic semiconductor circuit 225 also may be reduced when organic semiconductor circuit 225 is not reworked after organic semiconductor circuit 225 is completed.

Additionally, with the use of circuit manufacturing system 210 in manufacturing environment 200, the amount of weight and the space used in platform 206 may be reduced. This reduction in weight, space, or both weight and space used may be especially desirable when platform 206 takes the form of aircraft 208.

By forming semiconductor circuits 212 and, in particular, organic semiconductor circuits 214 on surface 230 of composite structure 204, space used within the interior of aircraft 208 may be reduced. For example, if organic semiconductor circuits 214 are for an in-flight entertainment system, use of space under passenger seats or in other portions of the passenger cabin may be reduced or unnecessary for the in-flight entertainment system. This reduction in the use of space within aircraft 208 may allow more space for passenger use, cargo, and other purposes.

Further, forming organic semiconductor circuits 214 on composite structure 204 also may make manufacturing aircraft 208 faster than currently possible. With the use of circuit printer system 218, the amount of time for operators to install wiring bundles and fasten computers and other systems into different locations in aircraft 208 may be reduced.

Figure 3:
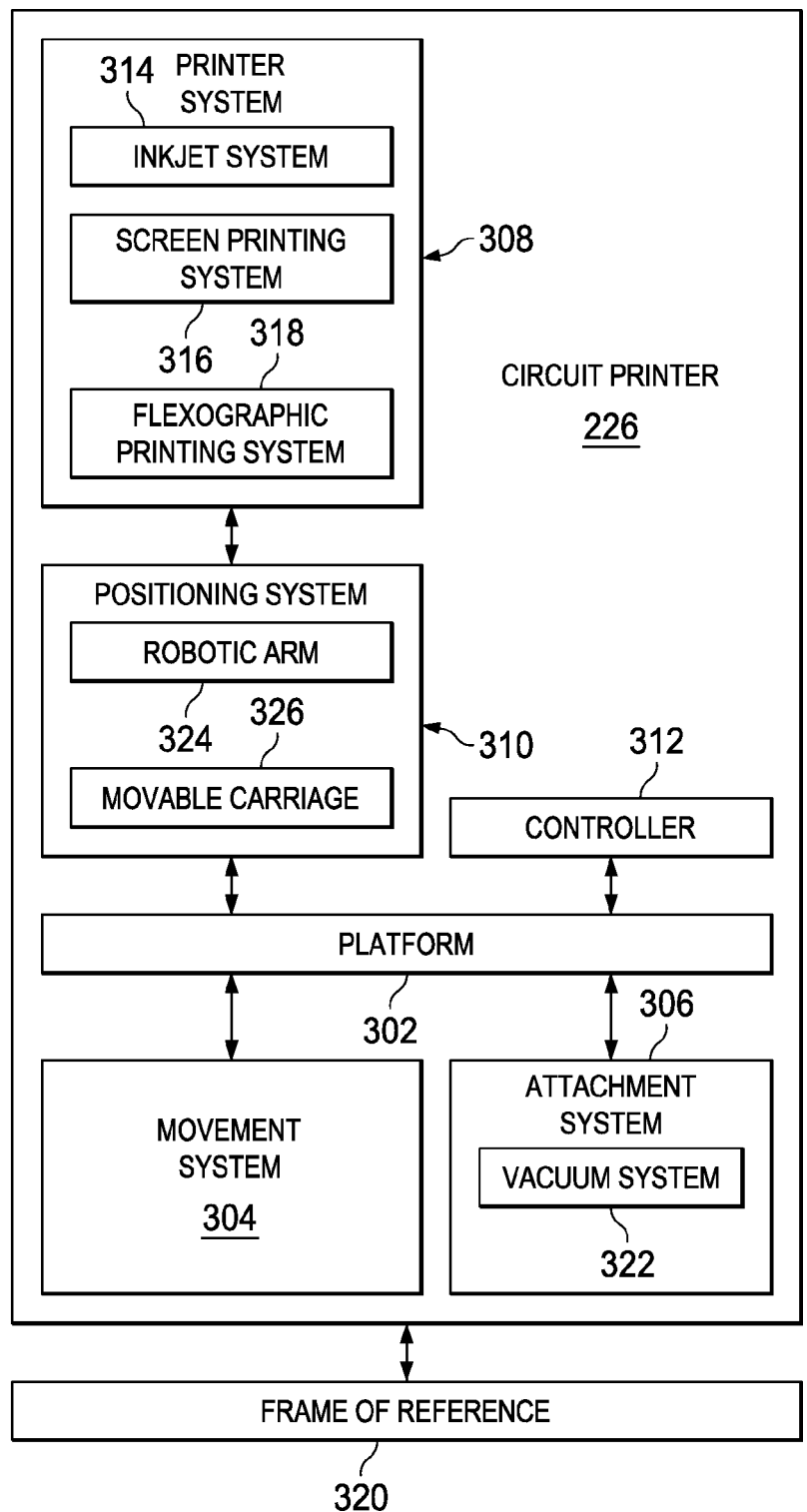
FIG. 3 is an illustration of a block diagram of a circuit printer in accordance with an illustrative embodiment.

Turning now to FIG. 3, an illustration of a block diagram of a circuit printer is depicted in accordance with an illustrative embodiment. Circuit printer 226 is an example of one manner in which a circuit printer in number of circuit printers 224 and circuit printer system 218 in FIG. 2 may be implemented.

In this illustrative example, circuit printer 226 includes a number of different components. As depicted, circuit printer 226 includes platform 302, movement system 304, attachment system 306, printer system 308, positioning system 310 and controller 312. In this illustrative example, platform 302 is a physical structure that supports printer system 308, positioning system 310, and controller 312.

In these illustrative examples, when platform 302 is a mobile platform, platform 302 may be associated with movement system 304. When one component is "associated" with another component, the association is a physical association in these depicted examples. For example, a first component, platform 302, may be considered to be associated with a second component, movement system 304, by being secured to the second component, bonded to the second component, mounted to the second component, welded to the second component, fastened to the second component, and/or connected to the second component in some other suitable manner. The first component also may be connected to the second component using a third component. The first component may also be considered to be associated with the second component by being formed as part of and/or an extension of the second component.

Movement system 304 is configured to move platform 302 to a location, such as location 228 in FIG. 2. In this illustrative example, movement system 304 may include at least one of wheels, tracks, legs, and other suitable devices configured to move platform 302.

As depicted, printer system 308 is associated with platform 302. In these illustrative examples, printer system 308 is associated with platform 302 indirectly through positioning system 310. Printer system 308 is configured to deposit number of organic materials 232 onto surface 230 of composite structure 204 with pattern 234 to form organic semiconductor circuit 225 at location 228 in FIG. 2.

In these illustrative examples, printer system 308 may take a number of different forms. For example, printer system 308 may include at least one of inkjet system 314, screen printing system 316, flexographic printing system 318, and other suitable types of printing systems configured to deposit number of organic materials 232 with pattern 234 to form organic semiconductor circuit 225 on surface 230 of composite structure 204 in FIG. 2.

As depicted, inkjet system 314 uses inkjet printing technologies typically used for printing documents. With inkjet system 314, number of organic materials 232 may be in liquid 236 in FIG. 2. Drops of liquid 236 may be propelled toward surface 230 of composite structure 204 at location 228 to form pattern 234 for organic semiconductor circuit 225 in FIG. 2.

With screen printing system 316, number of organic materials 232 may be applied to surface 230 of composite structure 204. In these illustrative examples, screen printing system 316 may include a number of stencils that may be placed over surface 230 of composite structure 204. Number of organic materials 232 may be applied to surface 230 through the stencil to form pattern 234 for organic semiconductor circuit 225.

In these illustrative examples, flexographic printing system 318 may place number of organic materials 232 onto a flexible relief plate. This flexible relief plate is similar to a letter press and may be used to deposit number or organic materials 232 onto surface 230 of composite structure 204 in pattern 234 to form organic semiconductor circuit 225.

In some illustrative examples, circuit printer 226 may include attachment system 306. Attachment system 306 is configured to connect circuit printer 226 to composite structure 204 to provide frame of reference 320. In these illustrative examples, attachment system 306 may be used in conjunction with movement system 304. When movement system 304 moves circuit printer 226 to location 228, attachment system 306 may connect circuit printer 226 to composite structure 204 at location 228.

In particular, attachment system 306 may connect at least one of platform 302, printer system 308, and positioning system 310 to composite structure 204. In other words, attachment system 306 may connect any one of these components or any combination of these components to composite structure 204 in these illustrative examples.

In one illustrative example, attachment system 306 may include vacuum system 322. Vacuum system 322 is configured to generate a vacuum that holds attachment system 306 along with the other components in circuit printer 226 on composite structure 204.

With attachment system 306, circuit printer 226 may be connected to composite structure 204 such that circuit printer 226 has frame of reference 320. Frame of reference 320 is the same frame of reference as composite structure 204 in these illustrative examples. Frame of reference 320 is with respect to changes such as movement of composite structure 204. As a result, with the same frame of reference, movement of surface 230 of composite structure 204 results in similar movement of circuit printer 226 relative to surface 230 of composite structure 204. In this manner, an occurrence of pattern 234 with inconsistency 250 deposited on surface 230 of composite structure 204 may be reduced. In other words, having the same frame of reference reduces an occurrence of an undesired pattern being deposited on surface 230 of composite structure 204.

In these illustrative examples, the movement of surface 230 may be caused by at least one of an expansion of composite structure 204, a contraction of composite structure 204, a vibration in the environment around composite structure 204, and other suitable sources that may cause surface 230 of the composite structure 204 on which organic semiconductor circuit 225 is being printed to move. The expansion and contraction of composite structure 204 may be caused by environmental factors such as temperature, humidity, and other changes in the environment around composite structure 204. In other words, printer system 308 may move relative to the movement of surface 230 of composite structure 204 such that pattern 234 deposited on surface 230 of composite structure 204 does not have inconsistency 250.

In these illustrative examples, attachment system 306 may take a number of different forms. For example, attachment system 306 may be vacuum system 322. Vacuum system 322 may generate a vacuum to attach circuit printer 226 to surface 230 of composite structure 204 to provide frame of reference 320 for circuit printer 226 that is the same as composite structure 204 and, in particular, in which frame of reference 320 is the same as surface 230 on composite structure 204 where organic semiconductor circuit 225 is formed.

In these illustrative examples, positioning system 310 is associated with platform 302 and printer system 308. Positioning system 310 is configured to position printer system 308 relative to location 228 in FIG. 2.

As depicted, positioning system 310 may take a number of different forms. Positioning system 310 may be, for example, at least one of robotic arm 324, movable carriage 326, and other suitable types of positioning systems.

As one example, robotic arm 324 may be associated with platform 302 and may hold printer system 308. In other illustrative examples, printer system 308 may take the form of an end effector for robotic arm 324. When movable carriage 326 is used, printer system 308 may be associated with movable carriage 326. Movable carriage 326 may move on platform 302. For example, platform 302 may include rails on which movable carriage 326 may move. This movement may be in a number of different directions along a number of different axes. These axes may provide movement in two dimensions or three dimensions depending on the particular implementation.

Controller 312 is associated with platform 302. Controller 312 is configured to control the operation of at least one of printer system 308, positioning system 310, movement system 304, and attachment system 306. In these illustrative examples, controller 312 may receive instructions from print controller 216 in circuit manufacturing system 210 in FIG. 2. These instructions may be used to perform the different operations to deposit number or organic materials 232 onto surface 230 of composite structure 204 at location 228 to form organic semiconductor circuit 225 in FIG. 2.

Figure 4:
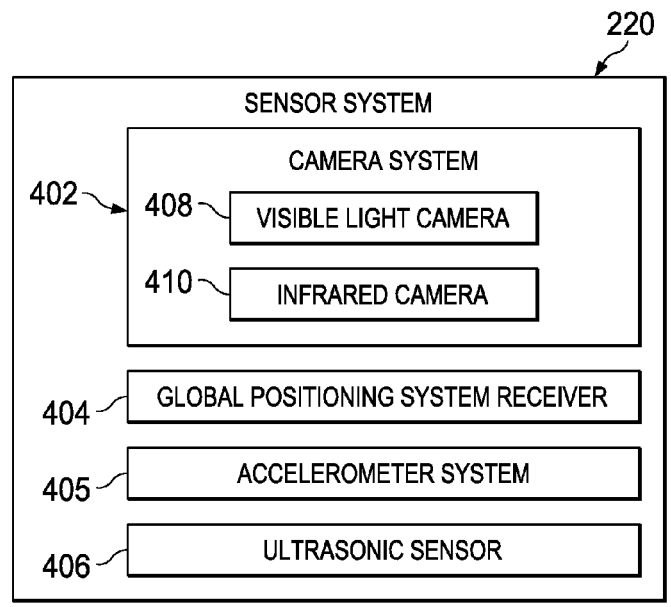
FIG. 4 is an illustration of components in a sensor system in accordance with an illustrative embodiment.

Turning now to FIG. 4, an illustration of a block diagram of components in a sensor system is depicted in accordance with an illustrative embodiment. In this illustrative example, examples of components that may be used in sensor system 220 are illustrated.

In this illustrative example, sensor system 220 may include at least one of camera system 402, global positioning system receiver 404, accelerometer system 405, and ultrasonic sensor 406. Camera system 402 may be used to generate number of images 248 in FIG. 2. Camera system 402 may include at least one of visible light camera 408 and infrared camera 410.

Global positioning system receiver 404 is configured to generate information about position 242 of circuit printer 226 in FIG. 2. This position may be location 244 in three dimensions. Accelerometer system 405 may be configured to generate information about orientation 246 of circuit printer 226 in position 242 for circuit printer 226.

Ultrasonic sensor 406 may be configured to identify a distance of printer system 308 in FIG. 3 from surface 230 of composite structure 204 in FIG. 2. In particular, ultrasonic sensor 406 may be used to identify a position of an inkjet nozzle, a screen, or other suitable device in printer system 308.

The illustration of manufacturing environment 200 and the different components illustrated in FIGS. 2-4 are not meant to imply physical or architectural limitations to the manner in which a manufacturing environment may be implemented to form circuits 202 on composite structure 204. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, although the illustrative examples for an illustrative embodiment are described with respect to platform 206 as aircraft 208, an illustrative embodiment may be applied to other types of platforms. Platform 206 may be, for example, a mobile platform, a stationary platform, a land-based structure, an aquatic-based structure, and a space-based structure. More specifically, the platform may be a surface ship, a tank, a personnel carrier, a train, a spacecraft, a space station, a satellite, a submarine, an automobile, a power plant, a bridge, a dam, a house, a manufacturing facility, a building, a vehicle, and other suitable platforms.

As another illustrative example, circuit printer system 218 may be configured to deposit a number of materials in addition to or in place of number of organic materials 232 in FIG. 2. For example, one or more of number of circuit printers 224 may be configured to deposit inorganic materials to form semiconductor circuits 212 that take the form of inorganic semiconductor circuits 215. Inorganic semiconductor circuits 215 may be combined or mixed with organic semiconductor circuits 214. In still other illustrative examples, chips containing semiconductor circuits may be attached to composite structure 204 and connected to organic semiconductor circuits 214.

As another example, movement system 304 may be omitted and circuit printer 226 may be placed at location 228 and attached to location 228 using attachment system 306. In yet other illustrative examples, attachment system 306 may be unnecessary in circuit printer 226.

Printer system 308 may include other types of printer systems in addition to or in place of the ones depicted. For example, printer system 308 may include an offset lithography system or other suitable system for depositing number of organic materials 232 onto composite structure 204.

Also, composite structure 204 may take various forms other than fuselage section 104 in FIG. 1. For example, composite structure 204 may also be selected from one of a fuselage, a wing box, a skin panel, a wing, a horizontal stabilizer, a vertical stabilizer, and others suitable components.

Figure 5:
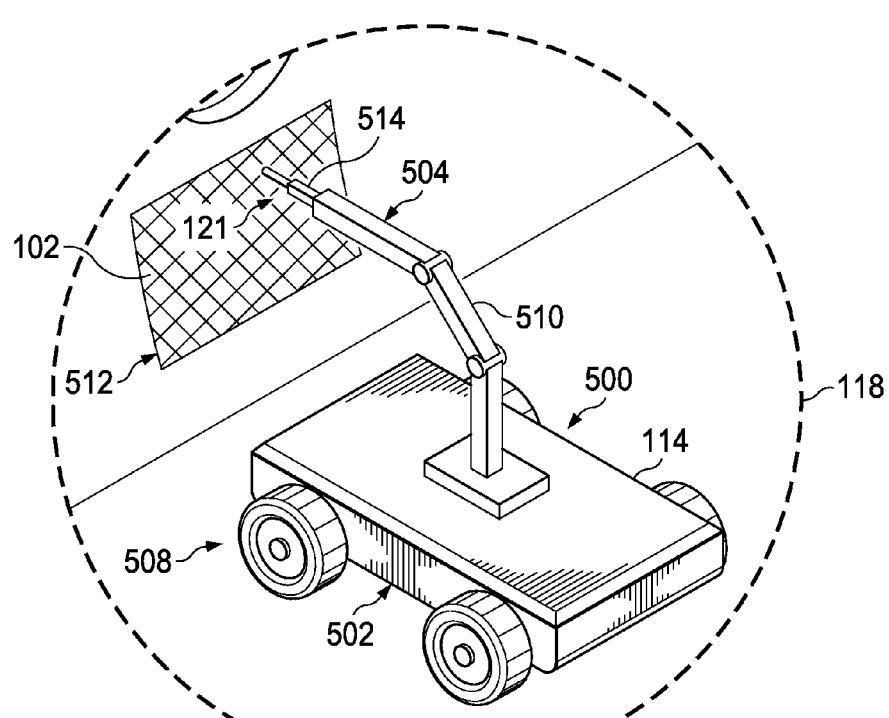
FIG. 5 is an illustration of a circuit printer in accordance with an illustrative embodiment.

Turning now to FIG. 5, an illustration of a circuit printer is depicted in accordance with an illustrative embodiment. In this figure, a more detailed view of circuit printer 114 at location 118 is shown. In this illustrative example, location 118 is circular in shape.

Circuit printer 114 has a number of different components. As depicted, circuit printer 114 includes platform 500, movement system 502, positioning system 504, and inkjet system 121.

In this illustrative example, platform 500 may be a vibration isolation platform. Movement system 502 includes wheels 508.

In this illustrative example, inkjet system 121 is an example of a printer system that is associated with positioning system 504. Positioning system 504 takes the form of robotic arm 510 and is associated with platform 500.

Positioning system 504 is configured to move inkjet system 121 within location 118 to deposit organic materials to form organic semiconductor circuit 512 in circuits 102. In this illustrative example, inkjet system 121 may be implemented in end effector 514 for robotic arm 510. Robotic arm 510 may move inkjet system 121 in end effector 514 about multiple axes.

Figure 6:
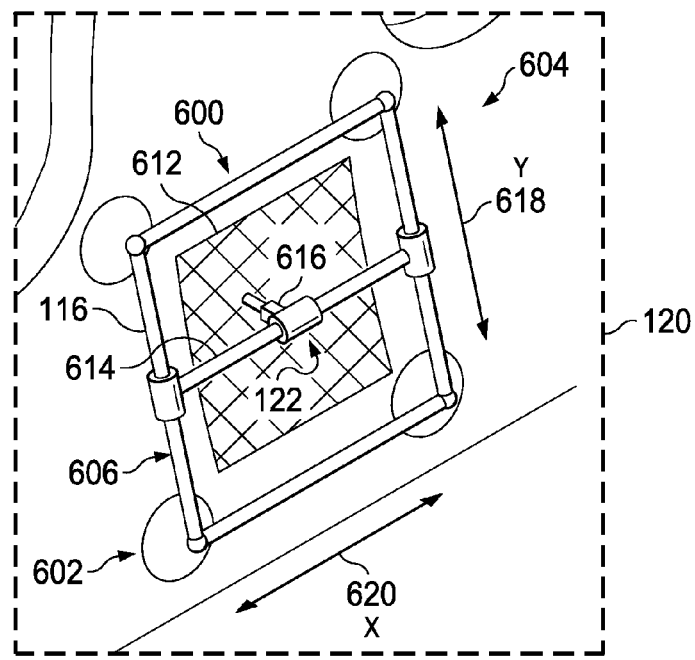
FIG. 6 is an illustration of a circuit printer in accordance with an illustrative embodiment.

Turning now to FIG. 6, an illustration of a circuit printer is depicted in accordance with an illustrative embodiment. In this figure, a more detailed view of circuit printer 116 at location 120 is shown. In this illustrative example, location 120 is rectangular in shape.

Circuit printer 116 has a number of different components. As depicted, circuit printer 116 includes platform 600, attachment system 602, positioning system 604, and inkjet system 122.

In this illustrative example, platform 600 takes the form of frame 606. Attachment system 602 is associated with frame 606. In particular, attachment system 602 may be a vacuum system. Attachment system 602 is configured to provide circuit printer 116 with a frame of reference. This frame of reference is with respect to fuselage section 104 in location 120 in FIG. 1.

In this illustrative example, inkjet system 122 is an example of a printer system and is associated with positioning system 604. Positioning system 604 is associated with platform 600. Positioning system 604 is configured to move inkjet system 122 within location 120 to deposit organic materials to form organic semiconductor circuit 612 in circuits 102.

In this illustrative example, positioning system 604 is comprised of movable bar 614. Nozzle 616 in inkjet system 122 is movable along movable bar 614. As depicted, movable bar 614 may move along platform 600 in the direction of arrow 618. Nozzle 616 may move along movable bar 614 in the direction of arrow 620. The direction of arrow 618 is substantially perpendicular to the direction of arrow 620. In this manner, nozzle 616 in inkjet system 122 may move in two dimensions.

Figure 7:
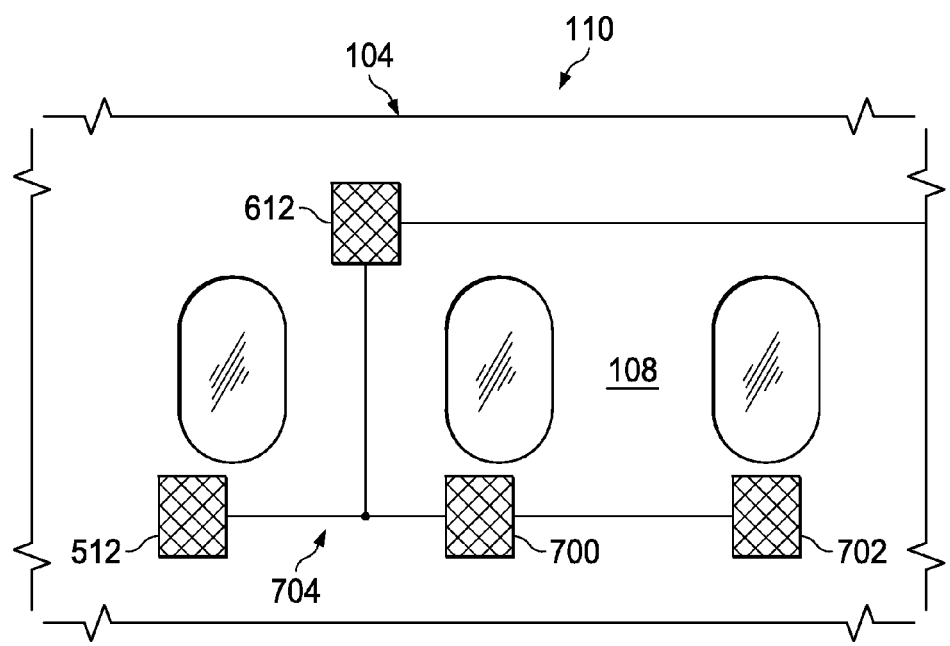
FIG. 7 is an illustration of the interior of a fuselage section with circuits in accordance with an illustrative embodiment.

Turning now to FIG. 7, an illustration of the interior of a fuselage section with circuits is depicted in accordance with an illustrative embodiment. In this illustrative example, circuits 102 are shown in a completed form on wall 108 within interior 110 of fuselage section 104.

As depicted, circuits 102 include organic semiconductor circuits. In this view of interior 110 of fuselage section 104, the organic semiconductor circuits in circuits 102 include organic semiconductor circuit 512, organic semiconductor circuit 612, organic semiconductor circuit 700, organic semiconductor circuit 702, and organic semiconductor circuit 704.

In this illustrative example, organic semiconductor circuit 512, organic semiconductor circuit, 612, organic semiconductor circuit 700, and organic semiconductor circuit 702 may be circuits for an in-flight entertainment system. Organic semiconductor circuit 704 may be trace lines that connect organic semiconductor circuit 512, organic semiconductor circuit 612, organic semiconductor circuit 700, and organic semiconductor circuit 702 to each other.

As can be seen, forming circuits 102 for an in-flight entertainment system and other devices on fuselage section 104 may increase the space available within interior 110 of fuselage section 104 for other uses by passengers, increased storage, and for other purposes.

The different components shown in FIG. 1 and FIGS. 5-7 may be combined with components in FIGS. 2-4, used with components in FIGS. 2-4, or a combination of the two. Additionally, some of the components in FIG. 1 and FIGS. 5-7 may be illustrative examples of how components shown in block form in FIGS. 2-4 can be implemented as physical structures.

For example, the illustrations of circuit printer 114, circuit printer 116, and organic semiconductor circuits in circuits 102 in FIG. 1 and FIGS. 5-7 are provided as examples of some implementations for circuit printer system 218 used to form organic semiconductor circuits 214 on composite structure 204 shown in block form in FIG. 2.

In other illustrative examples, other types of circuit printers may be used other than the ones illustrated. For example, a circuit printer may be implemented using a rail system. Rails may be attached to the composite structure using an attachment system such as a vacuum system. A printer system may be associated with a positioning system in the form of a carriage. The carriage may move along the rails to different locations on the composite structure to form the organic semiconductor circuits.

Figure 8:
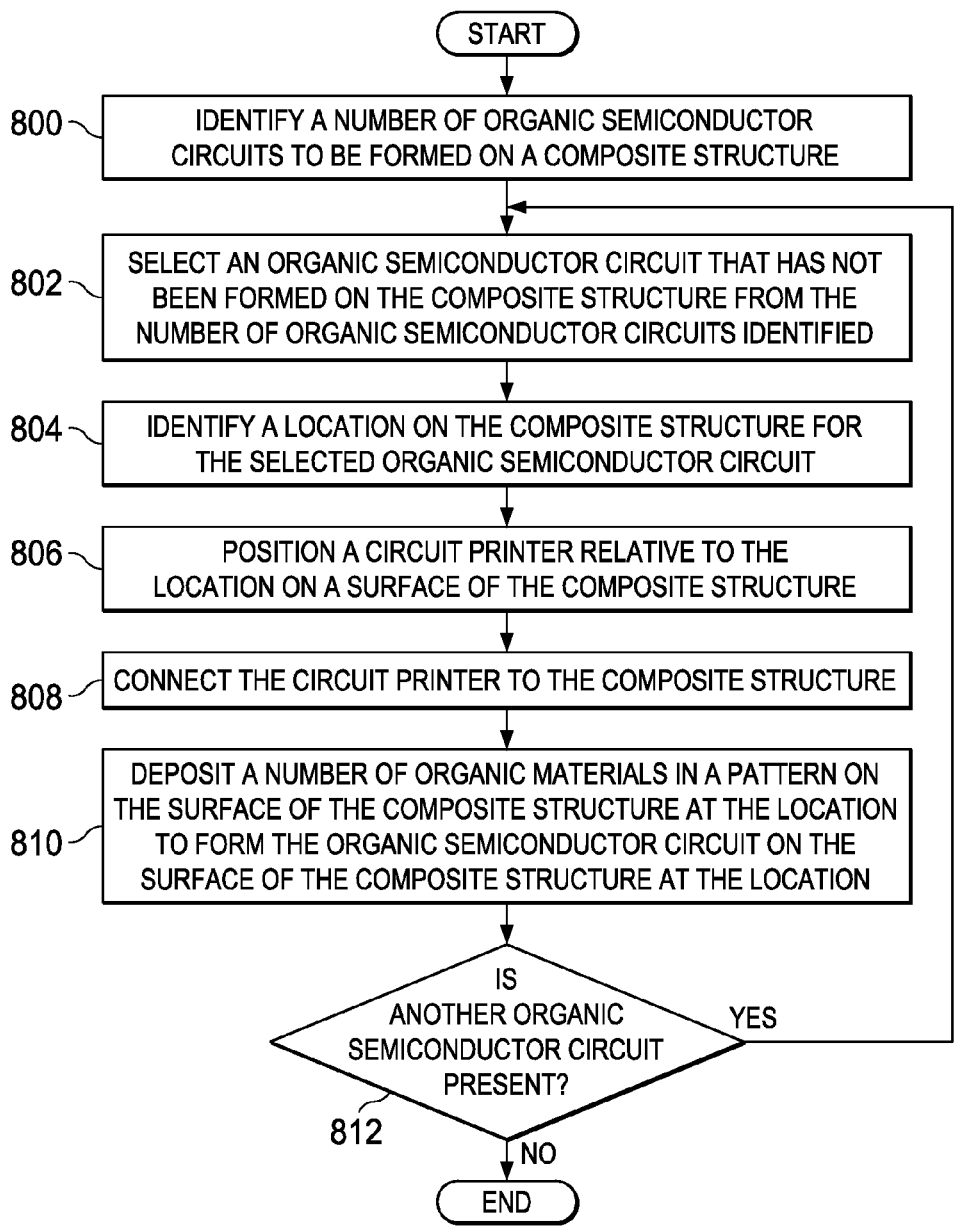
FIG. 8 is an illustration of a flowchart of a process for forming an organic semiconductor circuit in accordance with an illustrative embodiment.

Turning now to FIG. 8, an illustration of a flowchart of a process for forming an organic semiconductor circuit is depicted in accordance with an illustrative embodiment. In this illustrative example, the process illustrated in FIG. 8 may be used to form organic semiconductor circuit 225 on composite structure 204 using circuit manufacturing system 210 in FIG. 2. In particular, the different operations may be implemented using circuit printer system 218 under the control of print controller 216 in FIG. 2.

The process begins by identifying a number of organic semiconductor circuits to be formed on a composite structure (operation 800). These organic semiconductor circuits may be identified from a circuit design, a layout, or other source. Thereafter, the process selects an organic semiconductor circuit that has not been formed on the composite structure from the number of organic semiconductor circuits identified (operation 802).

A location on the composite structure for the selected organic semiconductor circuit is identified (operation 804). The process then positions a circuit printer relative to the location on a surface of the composite structure (operation 806). This positioning of the circuit printer may be accomplished by the circuit printer moving along the surface of the composite structure or the operator placing the circuit printer at the location.

The circuit printer is connected to the composite structure (operation 808). This connection is designed to provide a frame of reference for the circuit printer relative to the composite structure.

The process then deposits a number of organic materials in a pattern on the surface of the composite structure at the location to form the organic semiconductor circuit on the surface of the composite structure at the location (operation 810). The pattern for the number of organic materials may have multiple layers. In other words, each layer may have a sub-pattern that forms the pattern for the organic semiconductor circuit when all of the layers are deposited onto the surface of the composite structure.

A determination is made as to whether another organic semiconductor circuit is present in the number of organic semiconductor circuits identified that has not been formed on the composite structure (operation 812). If another organic semiconductor circuit is present for processing, the process returns to operation 802. Otherwise, the process terminates.

Figure 9:
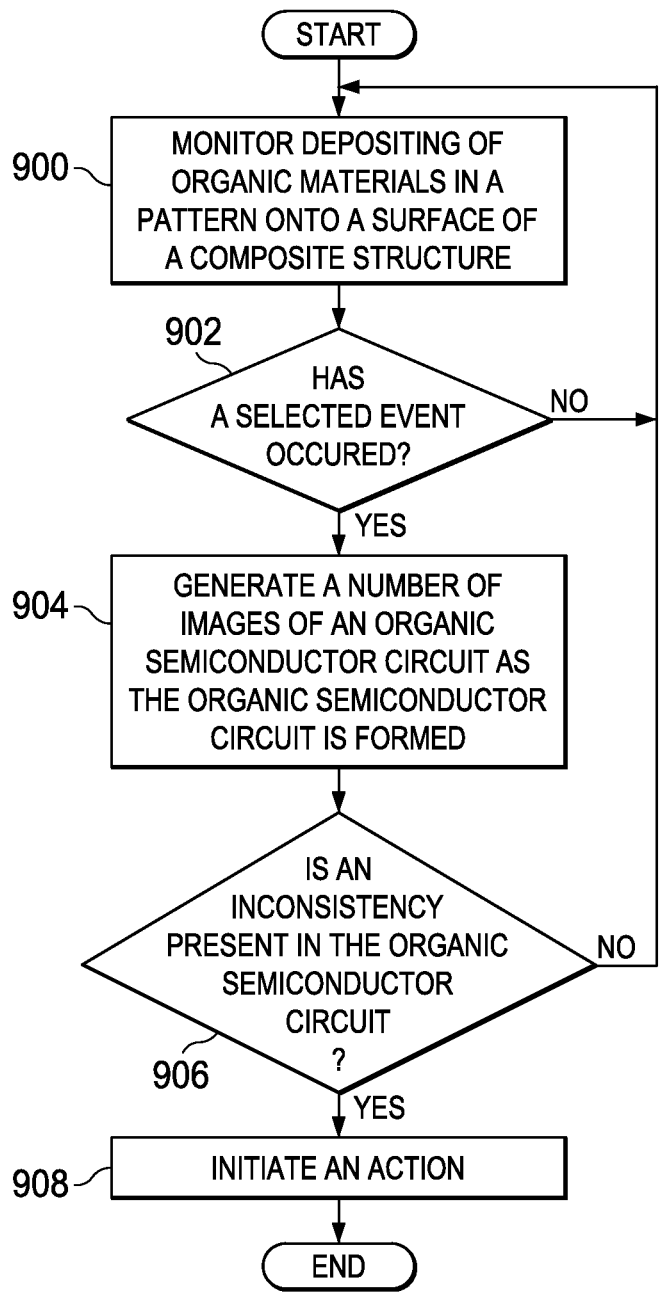
FIG. 9 is an illustration of a flowchart of a process for inspecting an organic semiconductor circuit in accordance with an illustrative embodiment.

Turning now to FIG. 9, an illustration of a flowchart of a process for inspecting an organic semiconductor circuit is depicted in accordance with an illustrative embodiment. The process illustrated in FIG. 9 may be implemented in circuit manufacturing system 210 to inspect organic semiconductor circuit 225 in FIG. 2. This process may be performed while organic semiconductor circuit 225 is formed or after organic semiconductor circuit 225 has been completed.

The process begins by monitoring the depositing of organic materials in a pattern onto a surface of a composite structure (operation 900). The process determines whether a selected event has occurred (operation 902). The selected event may be a periodic event or a non-periodic event. For example, the event may be every second, every two seconds, every thirty seconds, or some other period of time. In another example, the event may be a non-periodic event such as the completion of a layer of composite material, switching from one composite material to another composite material, or some other event.

In other words, the event may occur after or each layer of organic material is deposited onto the surface of the composite structure or during the formation of the pattern for the organic semiconductor circuit. If the selected event has not occurred, the process returns to operation 900.

Otherwise, the process generates a number of images of an organic semiconductor circuit as the organic semiconductor circuit is formed (operation 904). A determination is made as to whether an inconsistency is present in the organic semiconductor circuit using the number of images (operation 906). The process initiates an action when the inconsistency is present (operation 908) with the process terminating thereafter. The action may include at least one of generating an indication of the inconsistency, terminating depositing of the organic materials, and other suitable actions. If an inconsistency is not identified in the number of images, the process returns to operation 900.

As a result, if an inconsistency is identified before the organic semiconductor circuit is completed, rework may be completed to salvage the organic semiconductor circuit. In some cases, the rework may involve removing some of the organic materials and re-depositing those organic materials. In other cases, all of the organic materials may be removed and the process may be restarted to form the organic semiconductor circuit.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

For example, operation 808 may be optional. In some cases, the circuit printer may not be connected to the composite structure. In another illustrative example, the different operations in FIG. 9 may be performed after each organic semiconductor circuit is completed rather than during the formation of the organic semiconductor circuits.

Figure 10:
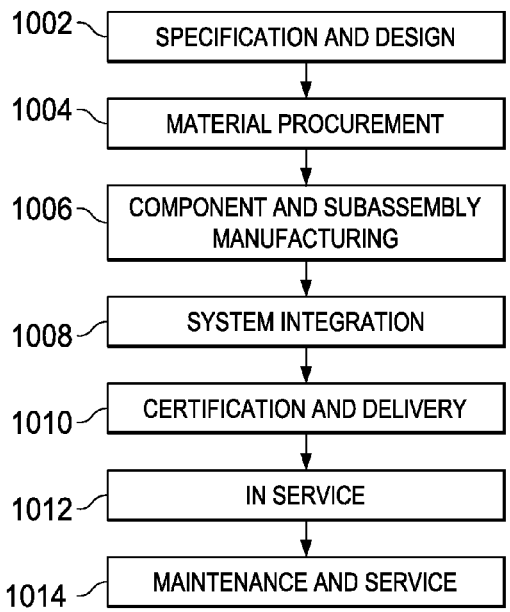
FIG. 10 is an illustration of an aircraft manufacturing and service method in accordance with an illustrative embodiment.
Figure 11:
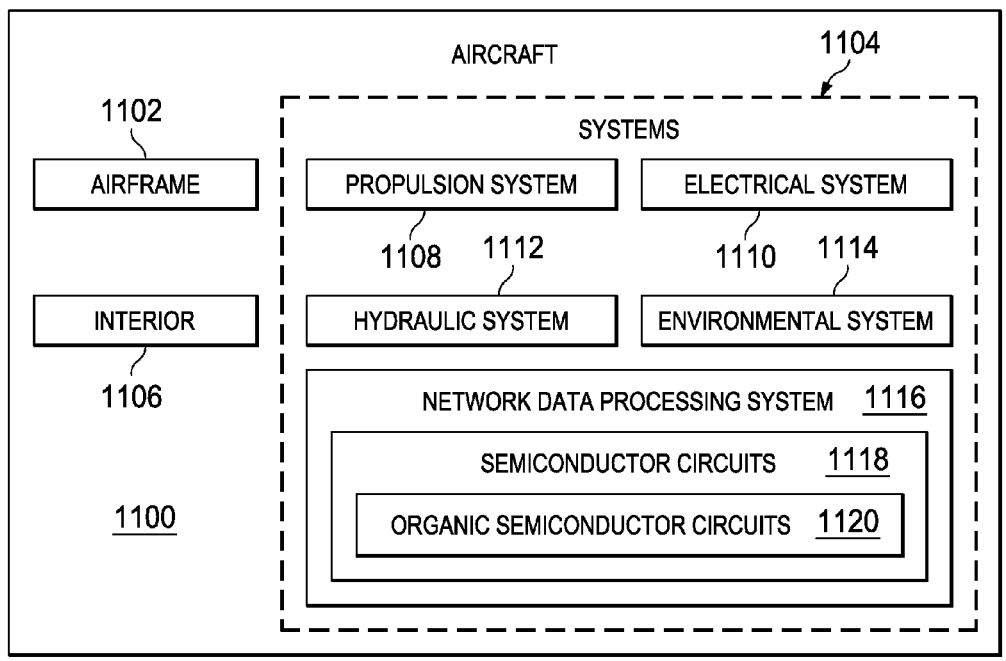
FIG. 11 is an illustration of an aircraft in which an illustrative embodiment may be implemented.

Illustrative embodiments of the disclosure may be described in the context of aircraft manufacturing and service method 1000 as shown in FIG. 10 and aircraft 1100 as shown in FIG. 11. Turning first to FIG. 10, an illustration of an aircraft manufacturing and service method is depicted in accordance with an illustrative embodiment. During pre-production, aircraft manufacturing and service method 1000 may include specification and design 1002 of aircraft 1100 in FIG. 11 and material procurement 1004.

During production, component and subassembly manufacturing 1006 and system integration 1008 of aircraft 1100 in FIG. 11 takes place. Thereafter, aircraft 1100 in FIG. 11 may go through certification and delivery 1010 in order to be placed in service 1012. While in service 1012 by a customer, aircraft 1100 in FIG. 11 is scheduled for routine maintenance and service 1014, which may include modification, reconfiguration, refurbishment, and other maintenance or service.

Each of the processes of aircraft manufacturing and service method 1000 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 11, an illustration of an aircraft is depicted in which an illustrative embodiment may be implemented. In this example, aircraft 1100 is produced by aircraft manufacturing and service method 1000 in FIG. 10 and may include airframe 1102 with a plurality of systems 1104 and interior 1106. Examples of systems 1104 include one or more of propulsion system 1108, electrical system 1110, hydraulic system 1112, environmental system 1114, and network data processing system 1116.

In this illustrative example, network data processing system 1116 may include any number of computer systems and electrical devices. The electrical devices may include sensors, transmitters, amplifiers, and other suitable electrical devices. The computer systems and electrical devices may be implemented using semiconductor circuits 1118. In particular, at least some of these devices may be implemented using organic semiconductor circuits 1120.

These different organic semiconductor circuits may be associated with structures in aircraft 1100 such as those in airframe 1102 within interior of aircraft 1100. The organic semiconductor circuits may be connected to electrical system 1110 to receive power and communicate with other systems in systems 1104.

Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 1000 in FIG. 10. In one illustrative example, components or subassemblies produced in component and subassembly manufacturing 1006 in FIG. 10 may be fabricated or manufactured in a manner similar to components or subassemblies produced while aircraft 1100 is in service 1012 in FIG. 10.

In the illustrative embodiments, organic semiconductor circuits 1120 may be formed using circuit manufacturing system 210 in FIG. 2 during components and subassembly manufacturing 1006, system integration 1008, or both. As yet another example, organic semiconductor circuits 1120 may be formed during maintenance and service 1014. Organic semiconductor circuits 1120 may be formed during maintained, refurbishment, upgrades, or other operation on aircraft 1100. Organic semiconductor circuits 1120 may be formed on existing composite structures, replacement composite structures, or a combination thereof during maintenance and service 1014. The use of a number of the different illustrative embodiments may substantially expedite the assembly of and/or reduce the cost of aircraft 1100.

Thus, the illustrative embodiments provide a method and apparatus for forming organic semiconductor circuits on composite structures. In these illustrative examples, the organic semiconductor circuits may be located on the composite structures, reducing the space taken in the interior of a platform such as an aircraft. As a result, this space may be used for other purposes. Further, by forming organic semiconductor circuits on composite structures on an aircraft, the amount of time and effort to form these circuits may be reduced as compared to installing devices and wiring bundles. As a result, the time and expense to manufacture an aircraft may be reduced.

Additionally, by forming organic semiconductor circuits on composite structures on an aircraft, non-destructive testing also may be performed. For example, non-destructive testing sensors with drive circuits may be formed on the composite structures on the aircraft. These sensors may include, for example, without limitation, eddy current probes, piezoelectric transducers, thermocouples, acoustic emission and strain gauges, and other suitable types of sensors. As a result of forming non-destructive testing sensors and circuits as part of a composite structure on the aircraft, non-destructive testing may be performed more efficiently than with currently used systems.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for forming an organic semiconductor circuit, the method comprising: positioning a circuit printer relative to a location on a surface of a composite structure; and depositing a number of organic materials in a pattern on the surface of the composite structure at the location to form the organic semiconductor circuit on the surface of the composite structure at the location;

wherein the composite structure is selected from one of a fuselage, a fuselage section, a wing box, a skin panel, a wing, a horizontal stabilizer, and a vertical stabilizer that form part of an aircraft; and wherein the composite structure is comprised of carbon.

2. The method of claim 1 further comprising:
connecting the circuit printer to the composite structure such that the circuit printer has a same frame of reference as the composite structure.

3. The method of claim 2, wherein movement of the same frame of reference of the surface of the composite structure results in similar movement of the circuit printer relative to the surface of the composite structure.

4. The method of claim 2, wherein the same frame of reference reduces an occurrence of an undesired pattern being deposited on the surface of the composite structure.

5. The method of claim 3, wherein the movement of the surface of the composite structure is caused by at least one of an expansion of the composite structure, a contraction of the composite structure, and a vibration.

6. The method of claim 1 further comprising:
identifying the location with a sensor system.

7. The method of claim 1 further comprising:
generating a number of images of the organic semiconductor circuit with a sensor system.

8. The method of claim 1 further comprising:
generating a number of images of the organic semiconductor circuit, when a selected event occurs, as the organic semiconductor circuit is formed;
determining whether an inconsistency is present in the organic semiconductor circuit using the number of images; and
initiating an action when the inconsistency is present.

9. The method of claim 1, wherein the composite structure is comprised of graphite.

10. An apparatus comprising:
a circuit printer configured to deposit a number of organic materials for an organic semiconductor circuit; and a controller configured to control the circuit printer to deposit the number of organic materials in a pattern on a surface of a composite structure at a location to form the organic semiconductor circuit on the surface of the composite structure;
wherein the composite structure is selected from one of a fuselage, a fuselage section, a wing box, a skin panel, a wing, a horizontal stabilizer, and a vertical stabilizer that forms part of an aircraft; and wherein the organic semiconductor circuit forms at least one of a sensor, a controller, a trace line, an environmental system controller, an in-flight entertainment system, and a health monitoring system.

11. The apparatus of claim 10 further comprising:
a camera system configured to generate a number of images of the organic semiconductor circuit as the number of organic materials is deposited on the surface of the composite structure in the pattern to form the organic semiconductor circuit.

12. The apparatus of claim 11, wherein the controller is configured to determine whether an inconsistency is present in the pattern of the number of organic materials from the number of images.

13. An apparatus comprising: a composite structure; and an organic semiconductor circuit formed on the composite structure;

wherein the composite structure is selected from one of a fuselage, a fuselage section, a wing box, a skin panel, a wing, a horizontal stabilizer, and a vertical stabilizer that forms part of an aircraft;

wherein the organic semiconductor circuit comprises a substrate; and wherein the substrate is comprised of at least one of a plastic film, indium tin oxide coated polyethylene terephthalate, and indium tin oxide coated aluminosilicate glass slides.

14. The apparatus of claim 13, wherein the organic semiconductor circuit is comprised of a number of organic materials configured to be applied to the composite structure by a circuit printer.

15. The apparatus of claim 13, wherein the composite structure is configured for use in a vehicle.

16. The apparatus of claim 13, wherein the organic semiconductor circuit forms at least one of a sensor, a controller, a trace line, an environmental system controller, an in-flight entertainment system, and a health monitoring system.

* * * * *